(12) United States Patent
Wang et al.

(10) Patent No.: US 7,732,827 B2
(45) Date of Patent: Jun. 8, 2010

(54) HIGH EFFICIENT PHOSPHOR-CONVERTED LIGHT EMITTING DIODE

(75) Inventors: Chien-Yuan Wang, Hsinchu (TW); Chih-Chiang Lu, Hsinchu (TW); Min-Hsun Hsieh, Hsieh (TW)

(73) Assignee: Epistar Corporation, Hsinchu (TW)

( * ) Notice: Subject to any disclaimer, the term of this patent is extended or adjusted under 35 U.S.C. 154(b) by 317 days.

(21) Appl. No.: 11/822,181

(22) Filed: Jul. 3, 2007

(65) Prior Publication Data

US 2008/0006815 A1 Jan. 10, 2008

(30) Foreign Application Priority Data

Jul. 4, 2006 (TW) .............................. 95124433 A

(51) Int. Cl.
*H01L 33/00* (2006.01)
*H01L 21/00* (2006.01)

(52) U.S. Cl. .......................................... 257/98; 438/29

(58) Field of Classification Search ............. 257/10–13, 257/79–106, E51.018–E51.022, E33.001–E33.077; 438/22–35
See application file for complete search history.

(56) References Cited

U.S. PATENT DOCUMENTS

| | | | |
|---|---|---|---|
| 2004/0119083 A1* | 6/2004 | Su et al. | 257/98 |
| 2006/0145172 A1 | 7/2006 | Su et al. | |
| 2006/0152150 A1* | 7/2006 | Boerner et al. | 313/506 |
| 2006/0158103 A1 | 7/2006 | Katano et al. | |
| 2006/0255713 A1* | 11/2006 | Kondo et al. | 313/486 |

* cited by examiner

*Primary Examiner*—Calvin Lee
(74) *Attorney, Agent, or Firm*—Bacon & Thomas, PLLC

(57) ABSTRACT

A light-emitting device and manufacturing method thereof are disclosed. The light-emitting device includes a substrate, a semiconductor light-emitting structure, a filter layer, and a fluorescent conversion layer. The method comprises forming a semiconductor light-emitting structure over a substrate, forming a filter layer over the semiconductor light-emitting structure, and forming a fluorescent conversion layer over the filter layer.

20 Claims, 2 Drawing Sheets

US 7,732,827 B2

HIGH EFFICIENT PHOSPHOR-CONVERTED LIGHT EMITTING DIODE

CROSS REFERENCE TO RELATED APPLICATIONS

This application claims the right of priority based on Taiwan Patent Application No. 095124433 entitled "High Efficient Phosphor-Converted Light Emitting Diode", filed on Jul. 5, 2006, which is incorporated herein by reference and assigned to the assignee herein.

TECHNICAL FIELD

This present disclosure relates to a light-emitting device and a method of forming the same, especially has a filter layer and a fluorescent conversion layer.

BACKGROUND OF THE DISCLOSURE

The white light LED (Light-emitting diode, LED) technology can be divided into single-chip type and multiple-chips type. The multiple-chips type using LEDs of three colors to mix the light emitted respectively into the white light. The benefit of the multiple-chips type is the flexibility of the light mixing based on different visual demand. However, the cost is relatively high for using many of LEDs chips at the same time. Furthermore, because the materials of making the LEDs with various colors are different, which needs different forward voltage (Vf) of the input, three sets of control circuit are needed. In addition, the speed of decay, the temperature characteristics and the life-time of the three kinds of LED chips are not the same, so the color of the white light is not stable and changes with time.

For single-chip type, there are three ways to manufacture the commercialized white light LED: 1. Blue LED chips combine with the yellow phosphor: The yellow phosphor used mainly is YAG phosphor of the yttrium aluminum garnet structure. The yellow light converted by the phosphor mixed with the unabsorbed blue light emitted from the blue LED can generate the white light. 2. Blue LED chips combine with the red and green phosphors: The phosphor used here is mainly containing sulfur. The red and green lights from the phosphor are combined with the unabsorbed blue light, and a white light is generated. 3. Ultraviolet LED chips combine with the red, blue and green phosphors: The ultraviolet light generated by the UV LED chips excites three or more kinds of phosphors which can respectively generates the light of red, blue and green at the same time, and the mixture of the lights mentioned above can generate the white light. To manufacture the above-mentioned devices, the phosphor and silicone is disposed into a concave after being mixed. However, it is difficult to mix the phosphor and silicone uniformly. As a result, the color temperature is uneven. When the light enters the phosphor-silicone layer from the LED, a high proportion (for example greater than 30%) of light can be back-scattered into the chips by the phosphor. Therefore, the light utilization efficiency is reduced.

U.S. Pat. No. 6,642,652 disclosed a flip-chip semiconductor light-emitting device covered by the phosphor structure formed by electrophoresis. But the method is difficult to distribute the powder uniformly in chip scale by controlling the electric field distribution and the electric charged state of the inorganic powder body, especially in the chip sidewall.

SUMMARY OF THE DISCLOSURE

This disclosure disclosed a light-emitting device and a method of forming the same. A phosphor layer is formed on the chip before encapsulation in order to avoid the disadvantage of above-mentioned known technology. Another purpose of the disclosure is to form a filter layer between LED and a fluorescent conversion layer to reduce the light luminescence efficiency loss from the LED and phosphor material stacking structure, and to improve the overall light luminescence efficiency of the device.

The light-emitting device of this disclosure includes a semiconductor structure with an active layer over a substrate, which can emit the first wavelength light; a fluorescent conversion layer over the semiconductor structure, which can absorb the first wavelength light emitted form the active layer of the semiconductor structure and can transfer the light into a second wavelength light; and a filter layer between the semiconductor structure and the fluorescent conversion layer, which has a light transmissivity of more than 50% to the first wavelength light and has a light reflectivity of more than 50% to the second wavelength light. Therefore, it can reduce the light luminescence efficiency loss caused by the absorption of the light which is back-scattered into the chip again during the transforming of the first wavelength light to the second wavelength light.

The filter layer of the light-emitting device of this disclosure is formed by one kind of material, or stacking or mixing two or more kind of materials. Such material has wavelength selectivity, which has a light transmissivity of more than 90% and lower light reflectivity to the ultraviolet light, or has a light transmissivity of lower than 5% and higher light reflectivity to the visible light.

BRIEF DESCRIPTION OF THE DRAWINGS

The foregoing aspects and many of the attendant advantages of this disclosure are more readily appreciated as the same becomes better understood by reference to the following detailed description, when taken in conjunction with the accompanying drawings, wherein.

DETAILED DESCRIPTION OF THE PREFERRED EMBODIMENTS

Figure 1:
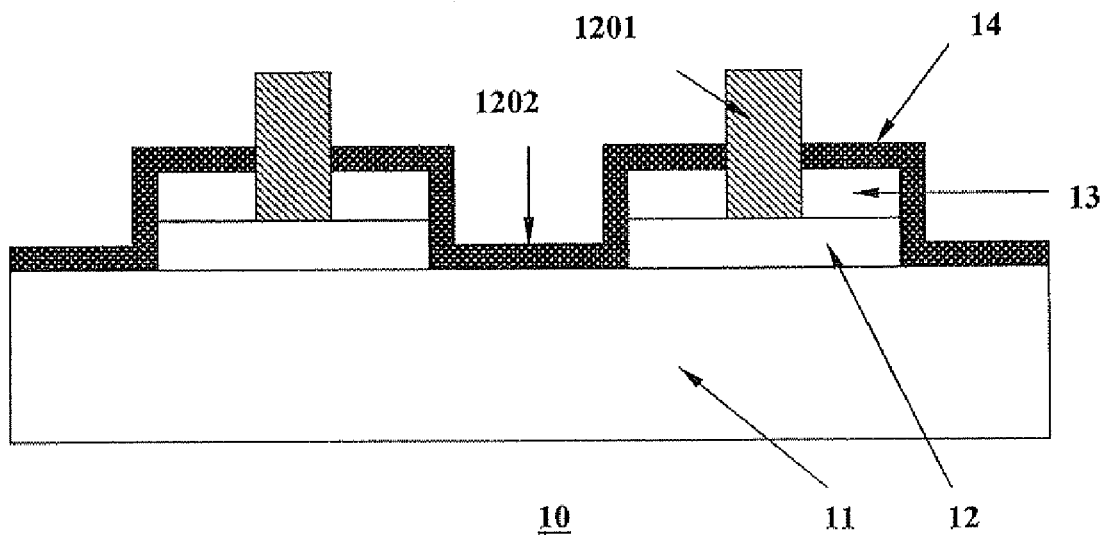
FIG. 1 is a schematic view of the first embodiment of the present disclosure.

FIG. 1 shows a schematic view of the preferred embodiment of the present disclosure. The disclosure discloses a light-emitting device 10 comprising a substrate 11, a semiconductor layer 12 having an active layer to emit a first wavelength light, a filter layer 13 and a fluorescent conversion layer 14. The material of the substrate 11 is composed of either opaque material or transparent material. For opaque material, it can be semiconductors metal or other opaque materials. In a preferred embodiment, the material of the substrate is selected from the group of Si, GaN/Si, GaAs and the combination of the above materials. For transparent materials, it can be glass, sapphire, SiC, GaP, GaAsP, ZnSe, ZnS or ZnSSe. The structure of the semiconductor structure 12 is either vertical (the electrical contacts located on the different side of the structure) or horizontal (the electrical contacts located on the same side of the structure). When the first wavelength light passes the filter layer 13 and enters the fluorescent conversion layer 14, it is absorbed and converted into a second wavelength light. The unabsorbed first wavelength light is mixed with the second wavelength light and a white light is generated consequently.

In addition, as FIG. 1 shows, more than two semiconductor structures 12 are formed by forming a trench 1202 on the substrate, and then a plurality of chips are formed by dicing process. The dicing process can also be performed after forming the filter layer 13 and the fluorescent conversion layer 14.

Figure 2:
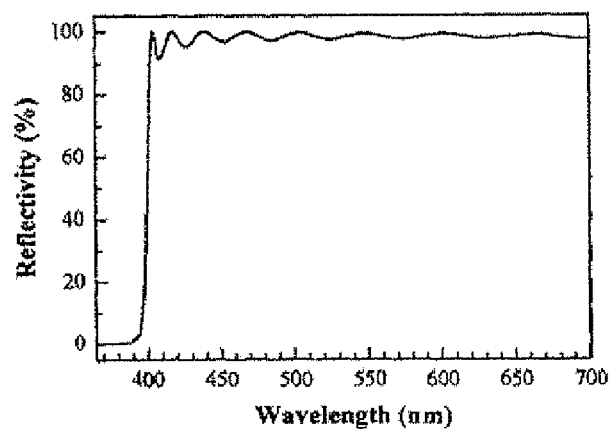
FIG. 2 is a reflectivity spectrum of the filter layer that is made by $TiO_2$ and $SiO_2$ in the first embodiment of the present disclosure.

A filter layer 13 is stacked by at least two materials with different refractive indexes and is formed on the semiconductor structure 12 by deposition process. The average light reflectivity is greater than 90% to the visible light. A preferred selection of the combination of the at least two materials with different refractive indexes is a higher refractive material with a refractive index of 2.1 to 2.6, such as $TiO_2$, $Nb_2O_5$ or $Ta_2O_5$, and a lower refractive material with a refractive index of 1.2 to 1.6, such as $SiO_2$ or $MgF_2$. The thickness of the filter layer is in the range from several tens of angstroms to several tens of micrometers, depending on the material characteristic. The filter layer can almost allow the whole transmission of the ultraviolet light. FIG. 2 shows a reflectivity spectrum of the filter layer that is made by TiO2 and SiO2.

A fluorescent conversion layer 14 is formed on the filter layer 13, and its forming method comprises the following steps:

(1) Surface modification of the fluorescent conversion material: Taking 0.3 gram of Yttrium Aluminum Garnet (YAG) phosphor and 5 ml of γ-3-glycidoxypropyldimethoxymethylsilane mixed with 30 ml of 95% (volume percentage) alcoholic solution. After heating the mixed solution to 70° C. and stirring for 2 hours, the powder in the solution is filtered out. Washing the powder with alcohol and drying it at 85° C., then a surface modified of the YAG phosphor.

(2) Formation of the fluorescent conversion material: Mixing the surface modified the YAG phosphor with the Isopropanol, then pouring them into the container with a wafer inside, waiting for the YAG phosphor powder deposited on the wafer surface by the gravity and leaving the upper solution clear. Distilling most of the upper clear solution, and then put the container into the oven with a temperature of 120° C. to form the fluorescent conversion material by baking YAG phosphor.

(3) Protection of the fluorescent conversion material: To survive the following light-emitting device manufacturing processes, the fluorescent conversion material must be anticorrosive and have strong adhesion. Using the hardened resin with the low viscosity and the high impermeability of ultraviolet light to form a film on the surface of the YAG fluorescent conversion layer can protect the device effectively.

The substrate 11 and the semiconductor structure 12 are electrically connected and then are diced to produce the light-emitting diode chips having a filter layer and a fluorescent conversion layer.

Figure 3:
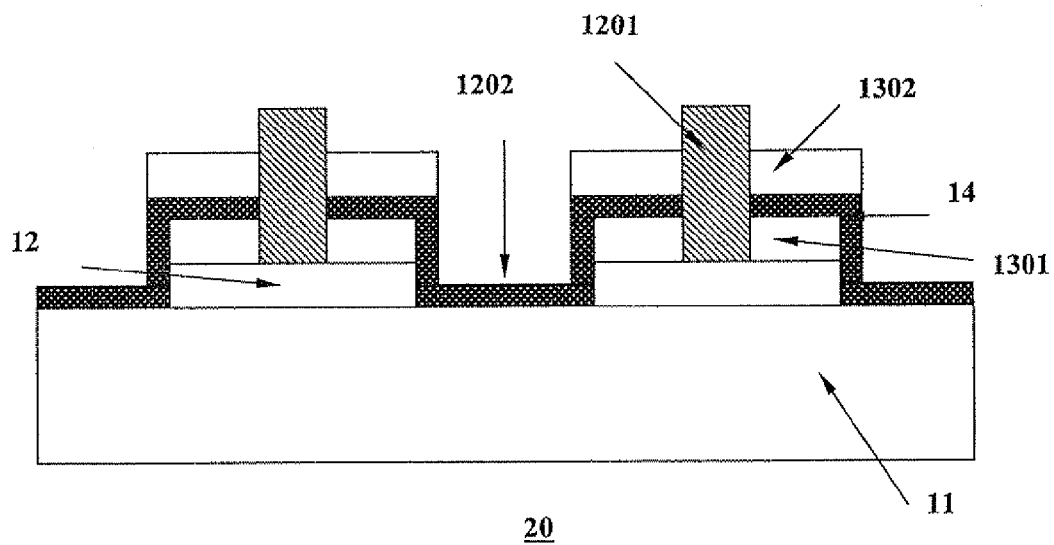
FIG. 3 is a schematic view of the second embodiment of the present disclosure.

FIG. 3 shows a schematic view of another preferred embodiment of the present disclosure. The numerals of the elements in this embodiment are the same as the elements in the first embodiment. The light-emitting device 20 structure and its manufacturing method are the same as the above-mentioned also. After forming the semiconductor structure 12 having an active layer, a first filter layer 1301 is then deposited on the active layer. Depositing a fluorescent conversion layer 14 on the fit filter layer 1301, and depositing a second filter layer 1302 on the fluorescent conversion layer 14 finally. The first filter layer 1301 has a light transmissivity of more than 50% to the first wavelength light and a light reflectivity of more than 50% to the second wavelength light. The second filter layer 1302 has a light reflectivity of more than 50% to the first wavelength light and has a light transmissivity of more than 50% to the second wavelength light.

The first filter layer 1301 is stacked by at least two materials with different refractive indexes. The at least two materials can almost allow the whole transmission to the ultraviolet light, and the average reflectivity of the materials is above 90% to the visible light (400 nm≦λ≦700 nm). The second filter layer 1302 is stacked by at least two materials with different refractive indexes. The average reflectivity of the materials is near 100% to the ultraviolet light, and is very low (≦1%) to the visible light. A preferred selection of the combination of the at least two materials with different refractive indexes is a higher refractive material with a refractive index of 2.1 to 2.6, such as $TiO_2$, $Nb_2O_5$ or $Ta_2O_5$, and a lower refractive material with a refractive index of 1.2 to 1.6, such as $SiO_2$ or $MgF_2$. The thicknesses of the filter layers are in the range from several tens of angstroms to several tens of micrometers depending on the material characteristic.

Although specific embodiments have been illustrated and described, it will be apparent that various modifications may fall within the scope of the appended claims.

We claim:

1. A light-emitting device, comprising:
    a semiconductor structure with an active layer emitting a first wavelength light;
    a conversion layer on said semiconductor structure, said conversion layer absorbs said first wavelength light and converts at least a portion of said first wavelength light into a second wavelength light; and
    a first filter layer in-between said semiconductor structure and said conversion layer, wherein said first filter layer having a light transmissivity of more than 50% to the first wavelength light and a light reflectivity of more than 50% to the second wavelength light.

2. A light-emitting diode, comprising:
    a semiconductor structure having an active layer to emit a first wavelength light;
    a conversion layer on said semiconductor structure, said conversion layer absorbs said first wavelength light and converts at least a portion of said first wavelength light into a second wavelength light;
    a first filter layer, in between said semiconductor structure and said conversion layer; and
    a second filter layer on said conversion layer wherein said light-emitting diode emits white light, and; wherein said second filter layer having a light reflectivity of more than 50% to said first wavelength light and a light transmissivity of more than 50% to said second wavelength light.

3. The light-emitting diode according to claim 2, wherein said first filter layer having a light transmissivity of more than 50% to said first wavelength light and a light reflectivity of more than 50% to said second wavelength light.

4. The light-emitting diode according to claim 2, wherein said first filter layer and said second filter layer are stacked by at least two materials with different refractive indexes.

5. The light-emitting diode according to claim 4, wherein each of said first filter layer and said second filter layer having a thickness in a range of several tens of angstroms to several tens of micrometers.

6. The light-emitting diode according to claim 4, wherein each of said first filter layer and said second filter layer having a higher refractive material with a refractive index of 2.1 to 2.6 and a lower refractive material with a refractive index of 1.2 to 1.6.

7. The light-emitting diode according to claim 6, wherein said higher refractive index material a is selected form a group of $TiO_2$, $Nb_2O_5$ and $Ta_2O_5$.

8. The light-emitting diode according to claim 6, wherein said lower refractive index material is selected form a group of $SiO_2$ and $MgF_2$.

9. The light-emitting diode according to claim 2, wherein said conversion layer includes a fluorescent material.

10. A light-emitting diode, comprising:
  a semiconductor structure with an active layer emitting a first wavelength light;
  a conversion layer on said semiconductor structure; and
  a first filter layer in-between said semiconductor structure and said conversion layer, wherein said first wavelength light passes through said filter layer and enters said conversion layer and is partially absorbed and converted into a second wavelength light and unabsorbed first wavelength light is mixed with said second wavelength light and white light is generated.

11. The light-emitting diode according to claim 10, wherein said first filter layer is composed of materials having a reflectivity selection or a transmissivity selection to light of different wavelengths.

12. The light-emitting diode according to claim 11, wherein said first filter layer is formed by a kind of material, or stacking or mixing two or more kind of materials.

13. The light-emitting diode according to claim 10, wherein said conversion layer is formed by at least one organic or inorganic luminescence material.

14. The light-emitting diode according to claim 10, wherein said first filter layer having a light transmissivity of more than 50% to the first wavelength light and a light reflectivity of more than 50% to the second wavelength light.

15. The light-emitting diode according to claim 10, wherein said first filter layer is stacked by at least two materials with different refractive indexes, and a thickness of said first filter layer is in a range of several tens of angstroms to several tens of micrometers.

16. The light-emitting diode according to claim 15, wherein said first filter layer has a higher refractive material with a refractive index of 2.1 to 2.6 and a lower refractive material with a refractive index of 1.2 to 1.6.

17. The light-emitting diode according to claim 16, wherein said higher refractive index material is selected form a group of $TiO_2$, $Nb_2O_5$ and $Ta_2O_5$.

18. The light-emitting diode according to claim 16, wherein said lower refractive index material is selected from a group of $SiO_2$ and $MgF_2$.

19. The light-emitting diode according to claim 10, further including a second filter layer on said conversion layer.

20. The light-emitting diode according to claim 10, wherein said conversion layer includes a fluorescent material.

* * * * *